United States Patent [19]

Bean et al.

[11] 3,838,441

[45] Sept. 24, 1974

[54] SEMICONDUCTOR DEVICE ISOLATION USING SILICON CARBIDE

[75] Inventors: Kenneth E. Bean, Richardson; Paul S. Gleim; Walter R. Runyan, both of Dallas, all of Tex.

[73] Assignee: Texas Instruments Incorporated, Dallas, Tex.

[22] Filed: June 12, 1970

[21] Appl. No.: 57,851

Related U.S. Application Data

[62] Division of Ser. No. 791,836, Dec. 4, 1968, abandoned.

[52] U.S. Cl. .................................... 357/49, 357/51

[51] Int. Cl. ............................................ H01l 19/00

[58] Field of Search ................................. 317/235 F

[56] References Cited

UNITED STATES PATENTS

| | | | |
|---|---|---|---|
| 3,290,753 | 12/1966 | Chang | 29/25.3 |
| 3,308,354 | 3/1967 | Tucker | 317/234 |
| 3,312,879 | 4/1967 | Goodejohn | 317/234 |
| 3,332,137 | 7/1967 | Kenny | 29/423 |
| 3,385,729 | 5/1968 | Larchian | 117/200 |
| 3,397,448 | 8/1968 | Tucker | 29/577 |

*Primary Examiner*—Martin H. Edlow
*Attorney, Agent, or Firm*—Harold Levine; James T. Comfort; Gary C. Honeycutt

[57] ABSTRACT

A modified semiconductor substrate structure has been developed for use in the fabrication of multiphase monolithic integrated microcircuits characterized by dielectric isolation, i.e., circuits wherein the active and/or passive components are electrically isolated from one another by virtue of their distribution in an array of monocrystalline semiconductor pockets surrounded by dielectric material. Silicon carbide is shown to be a particular by good dielectric for such use, either alone or in combination with prior dielectrics.

3 Claims, 18 Drawing Figures

SEMICONDUCTOR DEVICE ISOLATION USING SILICON CARBIDE

This application is a division of U.S. Pat. application Ser. No. 791,836, filed Dec. 4, 1969 now abandoned, which is a continuation of U.S. Pat. application Ser. No. 452,300, filed Apr. 30, 1965 now abaondoned.

This invention relates to a method of fabricating semiconductor components, and more particularly to a method whereby the semiconductor components are joined together by a common substrate but yet are electrically isolated through the substrate.

As the miniaturization of electronic circuits has evolved, it has become apparent that the greatest potential in microelectronics for greater reliability in performance and substantial savings in cost and space is being offered by a method whereby individual components such as transistors, resistors, diodes, etc. are formed within a single piece of semiconductor material, preferably a single crystal, the components being interconnected to perform the desired circuit function.

The formation of all components in one single crystal semiconductor substrate, however, presents the problem of electrically isolating the circuit components from one another. In particular, when a number of transistors are formed within one portion of the substrate, with the substrate forming the collector region of all the transistors, it is necessary for may circuit applications to isolate the transistors to avoid the collectors from being commoned.

Many techniques have been developed to accomplish this isolation, all of them possessing certain disadvantages. One technique, however, referred to as "insulated isolation" offers substantial advantages over the other methods. In copending U.S. Pat. application, Ser. No. 435,633, filed Feb. 26, 1965, and assigned to the assignee of the present application, there is described a method of isolation utilizing the broad concept of "insulated isolation," but offering considerable improvements thereto. In accordance with this process, a series of means are formed by etching upon a slice of low-resistivity monocrystalline semiconductor material. These mesas are then coated with an insulating medium, heretofore silicon oxide, and a thick layer of material is subsequently deposited over the top of the wafer so as to completely cover the oxide. The low-resistivity material which forms the substrate is then removed by lapping, leaving only the low resistivity mesa regions supported by the layer but isolated thereform by the silicon oxide. Thereafter portions of the low-resistivity material forming the mesas are selectively removed by vapor etching, and regions of high-resistivity monocrystalline semiconductor material are redeposited within the spaces left vacant by the selective vapor etch step. Into these regions circuit elements such as transistors, resistors, or other appropriate devices are then formed. As pointed out in the aforementioned copending application, this process provides a method whereby, among other advantages, close control may be maintained over the dimensions of the high-resistivity regions which form the collector regions of transistors, for example.

The object of this invention is to provide certain improvements over the present methods of "insulated isolation," and in particular over the method described in the aforementioned copening application. There are problems associated with the lapping or mechanical polishing step used to remove the substrate material, due primarily to the bowing of the semiconductor slice and to limitations on the ability to accurately align the slice with respect to the lapping or polishing apparatus. The bowing of the semiconductor slice presents the greatest problem. Each semiconductor slice contains dozens or even hundreds of mesa regions, into which individual circuit components are formed. As a consequene of the various steps preceding the lapping operation, the slice will bow, presenting a somewhat convex surface to the lapping apparatus. Hence, when the lapping operation is carried out in order to remove the substrate material from below the mesa regions, a considerable number of the mesas will be cut through and destroyed, thereby decreasing the total yield of each slice.

Other problems are encountered due to the use of silicon oxide as the insulating medium which electrically isolates the various circuit components within the common substrate. One of the major cuases of the bowing of the semiconductor wafer is the large variance between the thermal coefficients of expansion of the silicon oxide insulating medium and the semiconductor material, usually silicon, the ratio of the silicon to the silicon oxide being approximately eight. Consequently, when the wafer is subjected to large temperature variations, for instance during the deposition of the polycrystalline semiconductor material over the insulating oxide, the large mismatch in the coefficients of expansion will cause considerable bowing of the slice and induce thermal stresses throughout the entire wafer or slice.

Another disadvantage of using silicon oxide as the insulating medium arises after the selective vapor etch and epitaxial deposition steps and prior to the actual fabrication of the individual circuit components within the isolated pockets. At this time the oxide mask, which has been used in conjunction with the vapor etch and redeposition step, is removed by chemical etching and the surface of the slice is cleaned and prepared for diffusing or epitaxially depositiing the various active regions to form the junctions of the discrete components. During the oxide removal step, some of the insulating oxide medium at the surface is also removed. This removal of the insulating medium, in addition to destroying the isolation between the components, creates crevasses that prevent continuous leads or interconnections from being made between these components.

With these difficulties in mind, as well as many others that will subsequently be pointed out in this application, it is an object of this invention to provide a method for maintaining precise control over the amount and location of semiconductor material to be removed from a slice by abrasive means, such as lapping or polishing. In particular, it is an object of the invention to provide such a method in conjunction with a process of "insulated isolation" where the substrate material below the mesa regions is to be abrasively removed without destroying any of the mesa regions.

It is another object of the invention to provide a material to be used as the insulating medium adjacent the semiconductor material in an "insulated isolation" process, said insulating medium having a thermal coefficient of expansion relatively near that of the semiconductor material, thereby reducing the amount of bowing and thermal stress in the semiconductor wafer during processing, having a relatively high thermal conductivity, and being resistant to silicon oxide etchants.

In accordance with these and other objects and features, this invention involves the use of a hard refractory material, such as silicon carbide, selectively located at various positions within a semiconductor wafer, serving as a "stop" to a lapping or polishing operation. Alternatively, the hard material may be deposited as a continuous layer over the surface of the wafer, serving not only as a "stop" to the lapping and polishing, but also as the insulating layer electrically isolating individual components formed within the wafer.

The novel features believed characteristic of this invention are set forth in the appended claims. The invention itself, however, as well as other objects and advantages thereof, may best be understood by reference to the following detailed description of illustrative embodiments, read in conjunction with the accompanying drawings, wherein:

Figure 1:
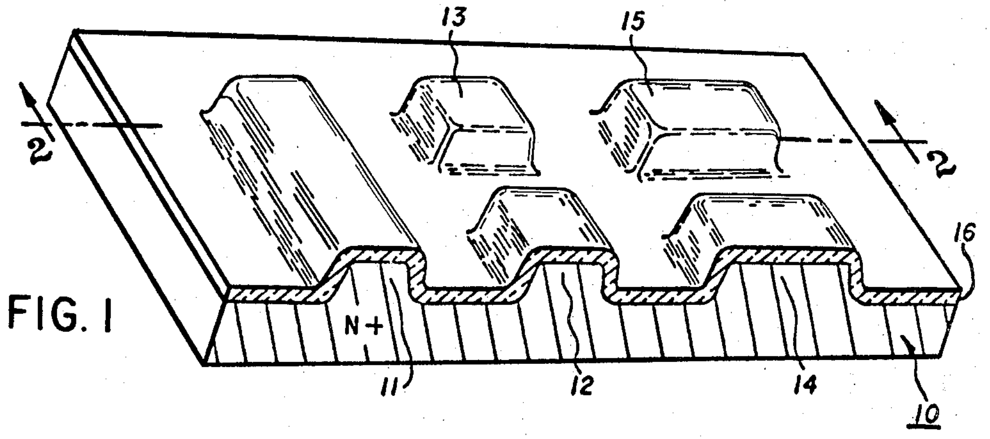
FIG. 1 is an isometric pictorial view in section of a semiconductor wafer in an early stage of the production of an integrated circuit in accordance with the process of this invention.
Figure 2:
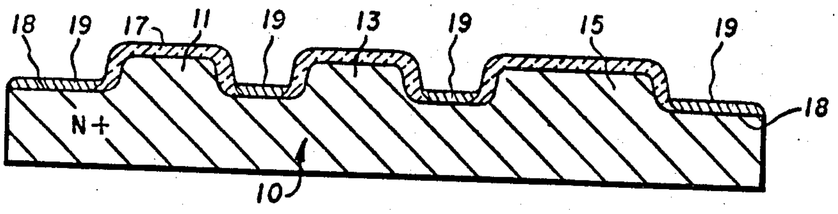
FIGS. 2–4 are elevational views in section of the semiconductor body of FIG. 1 in successive stages of production.

Referring now to FIG. 1, there is now described the first step in one embodiment of this invention. A slice of single crystal semiconductor material, such as silicon, is used as the starting material. The slice may be about 1 inch in diameter and 10 mils thick. A small segment of the slice may be represented as a chip or wafter 10, a portion of which represents the segment to be occupied by one integrated circuit. The top surface of the slice is first masked and etched to form a pattern of raised mesas 11–15. The masking may be by a material such as wax, or preferably by the photoresist techniques which permit excellent geometry control. The height of the mesas 11–15, or, in other words, the depth of the etching, may be about 2 mils. At this point the top surface of the slice is covered with a silicon oxide insulating coating 16 which may be formed by any conventional technique to a thickness of perhaps 10,000 A. For instance, the coating 16 may be thermally grown by exposing the slice to steam at about 1,200° C. The mesas are now masked with photoresist and the silicon oxide coating selectively removed in the surrounding areas by etching, leaving oxide layers 17 on each mesa, as seen in FIG. 2. Alternatively, the oxide coating 16 may be left on at this stage, the layers 17 being left by a subsequent lapping operation. The top surface of the slice is then cleaned to remove all traces of oxide, organics from the photoresist, and other contaminants from the uncoated surface areas 18.

As the next step in the process, individual layers 19 of silicon carbide are selectively deposited upon the uncoated surfaces 18 between the mesa regions, as shown in FIG. 2. The selective deposition is accomplished by first masking the top of the wafer 10 so that only the regions between the mesas are exposed, and then placing the wafer in a reactor such as the one shown in FIG. 8, for example. The mask may be fabricated of any suitable material; as one particular example, however, a thin wafer of silicon with a plurality of holes formed completely through and at select locations upon the thin wafer was placed over the wafer 10 shown in FIG. 2, and the holes through the thin wafer are respectively aligned over the surface areas 18 between the mesas. The masked wafer 10 was then placed in the reactor shown in FIG. 8.

Figure 8:
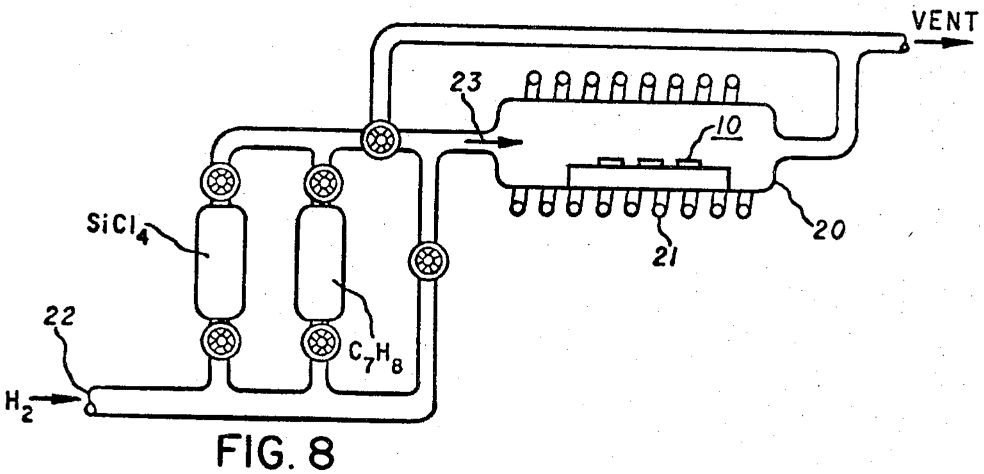
FIG. 8 is a front elevation of one form of apparatus used in the process of this invention.

Referring to FIG. 8, apparatus for depositing the silicon carbide in accordance with the process comprises a reactor in the form of a tube 20 having heating coils 21. The furnace may be of a horizontal or vertical type, may be suited for single or multiple slices, and may be either resistively or inductively heated. The masked silicon wafers including the wafer 10 are disposed within the furnace in such a position as to expose the slices to gases directed into the tube through a conduit 23. Toulene ($C_7H_8$) and silicon tetrachloride ($SiCl_4$) vapors are respectively introduced into the conduit 23 from cylinders containing liquid toulene and liquid silicon tetrachloride, through which hydrogen gas is bubbled. Purified dried hydrogen enters end 22 of the conduit. The flow of the gases into the tube furnace 20 is regulated by conventional valves.

The rate of deposition is determined largely by the temperature at which the reactor is maintained, the flow rate through the conduit 23, and the percentage composition of the constituents. For example, when the flow rate was kept at approximately 10 liters/minute, the temperature at approximately 1,100° C, and the reactive mixture consisted of 0.9 mole percent $SiCl_4$, 0.1 mole percent $C_7H_8$, and 99 mole percent $H_2$, silicon carbide was deposited upon the wafer 10 at the locations 18 (see FIG. 2) at a rate of approximately 1 micron/minute. The mask was then removed, leaving the silicon carbide layers 19.

Figure 3:
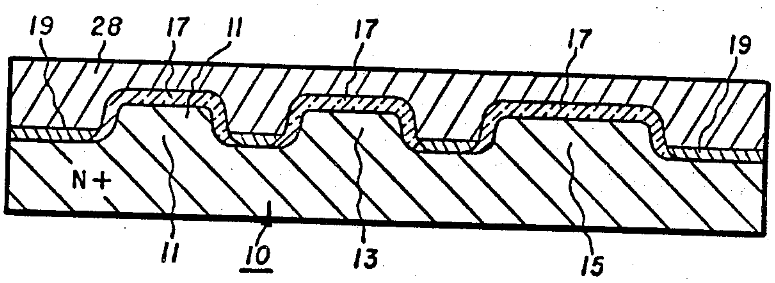

A layer 28 of material, for example polycrystalline semiconductor material, is now deposited over the top surface of the slice 10, as seen in FIG. 3. The most common method of deposition is by the hydrogen reduction of silicon tetrachloride, a technique well known in the art and requires no elaboration here. The conductivity-type of the layer 28 is not critical as ti may be N-type, P-type, or intrinsic, and the thickness of the layer should be perhaps 7 or 8 mils or more to facilitate handling the unit without breakage. The layer may also be either single-crystalline, polycrystalline, or amorphous.

Figure 4:
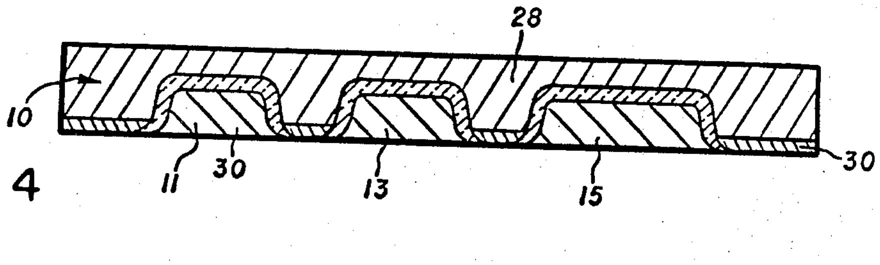

As the next step in the process of this invention the structure of FIG. 3 is subjected to a lapping and polishing treatment on its lower face to remove all of the original silicon material except that portion remaining within the mesas 11–15, as illustrated in FIG. 4. During the prior deposition of the semiconductor layer 28, the wafer or slice 10 bows, presenting a somewhat convex surface to the lapping and polishing apparatus. Consequently, if the silicon carbide "stops" are not present, it will not be possible to avoid cutting through a considerable number of the mesas on the wafer.

Figure 5:
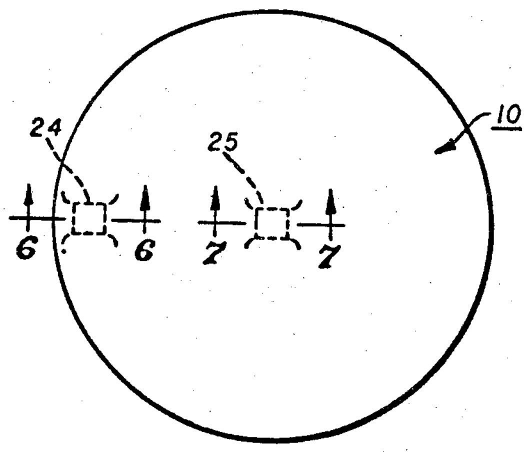
FIG. 5 is a top view of an entire wafer showing two of the mesa regions formed thereupon.
Figure 6:
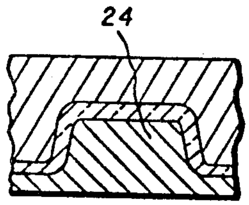
FIG. 6 is a sectional view of a portion of the wafer shown in FIG. 5, taken along the section line 6—6.
Figure 7:
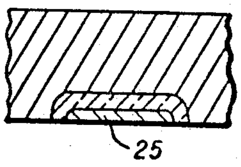
FIG. 7 is a sectional view of another portion of the wafer shown in FIG. 5, taken along the section line 7—7 of FIG. 5.

This difficulty is clearly illustrated with reference to FIGS. 5, 6, and 7. Looking at FIG. 5, the top view of an entire wafer or slice, there is depicted two of the many mesa regions 24 and 25 that are formed upon the wafer. When the wafer is subjected to the lapping and polishing operation without first depositing the silicon carbide stops, a mesa region 25 located at the center of the wafer, for example, will be completely or substantially cut through, as depicted by the cross-sectional view of FIG. 7. On the other hand, a substantial amount of material is still remaining beneath a mesa region 24 near the end of the wafer, as depicted by the cross-sectional view of FIG. 6, the lapping not yet having reached the mesa 24, the mesa therefore not being isolated due to the convex bowing of the wafer.

However, when the silicon carbide layers 19 are deposited as shown in FIGS. 2–4, and the wafer 10 is subjected to the lapping and polishing operation in order to remove the substrate material beneath the mesas 11–15, each of the silicon carbide "stops" halts the lapping or polishing in its respective area, the lapping continuing in other areas until all of the "stops" have been reached, thereby producing the structure of FIG. 4 wherein the regions of unremoved silicon material within the mesas are of substantially identical depth, are isolated from each other, and none of the mesas upon the wafer have been cut through. Thereafter, individual circuit components may be formed within the individual mesa regions (which are now pockets of single crystal semiconductor material) and interconnected to perform the desired circuit function.

Figures 9, 10, 11, 12:
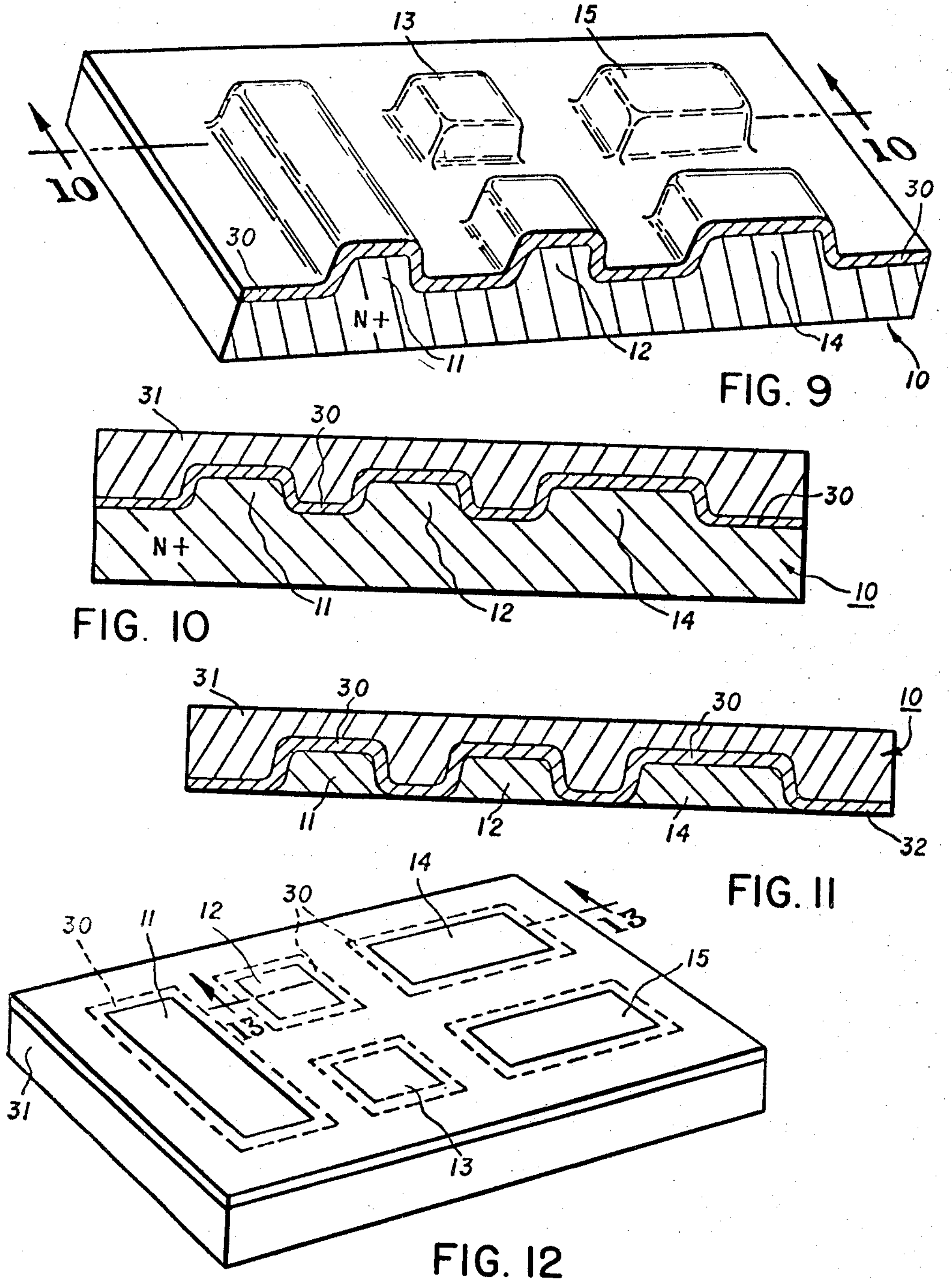
FIG. 9 is an isometric pictorial view in section of a semiconductor wafer showing the use of the improved material of this invention.
FIGS. 10 and 11 are elevational views in section of the semiconductor body of FIG. 9 in successive stages of production.
FIG. 12 is an isometric pictorial view of the lower side of the semiconductor body of FIG. 11.

As an alternative to masking the wafer 10 and depositing the silicon carbide at selective locations upon the wafer, a continuous layer of silicon carbide may be formed over the wafer after the insulating oxide has been deposited. As a preferred embodiment of the invention, however, it is desirable to use a hard material, as silicon carbide, not only as a "stop" to the lapping and polishing, but also as the sole insulating layer electrically isolating the various components. In accordance with this objective, a wafer 10 of low-resistivity semiconductor material has mesa regions 11–15 covered with a coating 30 of high resistivity silicon carbide, as shown in FIG. 9, the coating being deposited in the same manner as heretofore described, although without the need for masking the top of the wafer. As an alternative, however, it may be desirable first to deposit, by conventional techniques, a layer of metal, such as molybdenum or tungsten, before the silicon carbide coating is deposited. The metal layer, being adjacent the low resistivity substrate, has the effect of further lowering the resistance in this area. The semiconductor layer 31 is then deposited as before over the top surface of the slice 10, as seen in FIG. 10. The wafer structure is then subjected to the lapping and polishing step to remove the excess semiconductor material beneath the mesa regions 11–15, resulting in the structure shown in FIG. 11. Looking at the structure of FIG. 11, it is to be observed that using a hard refractory material such as silicon carbide as the insulating layer rather than silicon oxide, for example, the semiconductor layer 31 is not exposed by the lapping and polishing operation, as it would be if silicon oxide alone was used.

It is to be noted at this point, and as a particular aspect of the invention, that the silicon carbide coating 30 serves many functions. In addition to serving as a continuous "stop" to the lapping and polishing operation, it reduces the amount of bowing of the semiconductor, particularly during the deposition of the semicondcutor layer 31. Since the wafer 10 is subjected to large temperature variations during this deposition process, the fact that the silicon carbide has a thermal coefficient of expansion approximately equal to the silicon substrate upon which it is deposited will mean considerably less bowing of the wafer as well as reduced thermal stresses therein.

Inverting the device and looking at what was the bottom surface or face 32 of FIG. 11, but will now be considered the top face of the unit, the structure will appear as in FIG. 12. Each of the low resistivity N+ monocrystalline portions or pockets 11–15 is insulated from the others and from the substrate or layer 31 by the silicon carbide coating 30. This coating 30 is not shown to scale in the drawings, and would actually be perhaps an order of magnitude thinner in proportion than is shown in the sectional view of the drawings.

Figure 13:
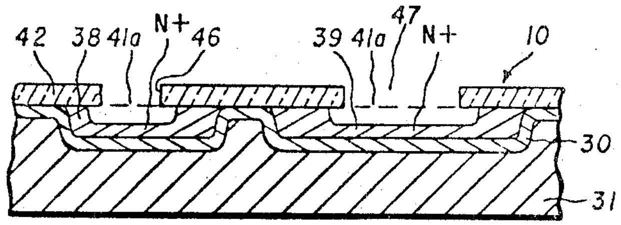
FIGS. 13–15 are sectional views of a portion of the wafer of FIG. 12 taken along the line 13—13, showing subsequent steps of the process of this invention.

An oxide layer 42 is then formed upon the upper surface or face of the wafer 10, as depicted in FIG. 13. The oxide layer, which might be silicon oxide for example, should preferably be of a thickness in excess of 10,000 A, and may be formed by any conventional technique. For example, it may be thermally grown by heating the entire structure to a temperature of approximately 1,200° C in the presence of oxygen. Through the use of photographic masking and etching techniques, for example, a select portion of the oxide layer 42 is removed so as to expose a corresponding portion of the low resistivity semiconductor substrates 38 and 39 within the apertures or windows 46 and 47, respectively. This removal may be accomplished by covering the oxide layer 42 with photoresist, exposing and developing the photoresist, and etching away the unmasked areas of the oxide. By this method, the oxide mask shown in section in FIG. 13 is produced directly on the wafer surface. The mask thus produced will limit the area of the substrate that is to be affected by the subsequent vapor etch and epitaxial redeposition steps.

Figure 14:
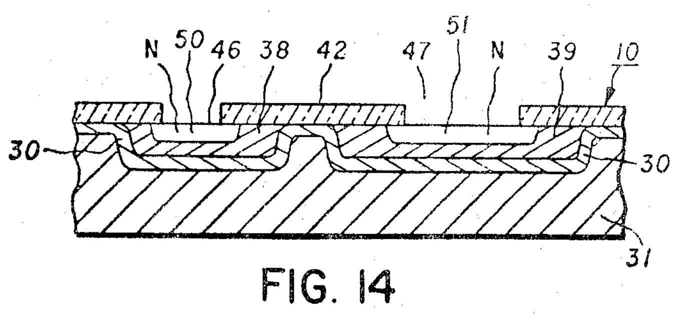

As the next step in the process of the present invention the wafer 10 is subjected to a selective vapor etch which removes a select portion of the low resistivity substrates 38 and 39 below the dotted line **41*a*, as observed in FIG. 13. The wafer 10 is thereafter subjected to an epitaxial deposition step whereby, as shown in FIG. 14, regions 50 and 51 of high resistivity N-type semiconducting material are redeposited within the vacant spaces produced by the vapor etch step previously described. The N-type regions 50 and 51 are formed adjacent the low resistivity N+ regions 38 and 39, also depicted in FIG. 14.** Various desired arrangements may be utilized as well as various techniques applied in order to accomplish the steps of vapor etching and epitaxially redepositing within the unmasked regions. A preferred method is described in copening U.S. Pat. application, Ser. No. 435,633.

Figure 15:
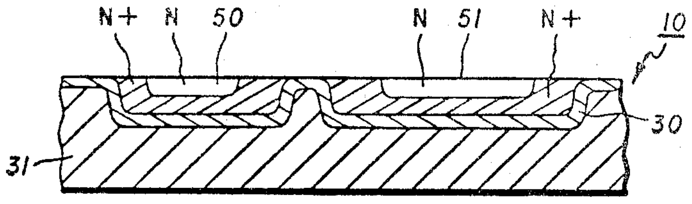

After the epitaxial redesposition, the silicon oxide mask 42 is removed, as shown in FIG. 15, by subjecting the top surface of the wafer 10 to an etchant, such as hydrofluoric acid, which will etch away the oxide while substantially unaffecting the silicon material underneath. Another advantage for using silicon carbide as the material of which the insulating layer 30 is formed should be pointed out at this time. Since silicon carbide is virtually unaffected by hydrofluoric acid, the insulating layer 30 will remain intact, no crevasses being generated therein as would be the case when the layer 30 is formed of silicon oxide, for example.

Figure 16:
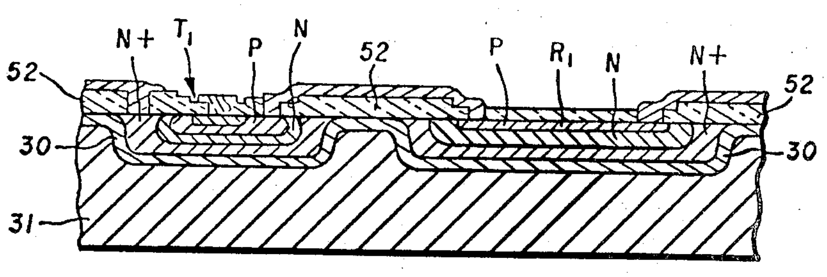
FIG. 16 is the same sectional view as FIGS. 13–15 after diffusion operations have been completed and interconnections have been applied.
Figure 17:
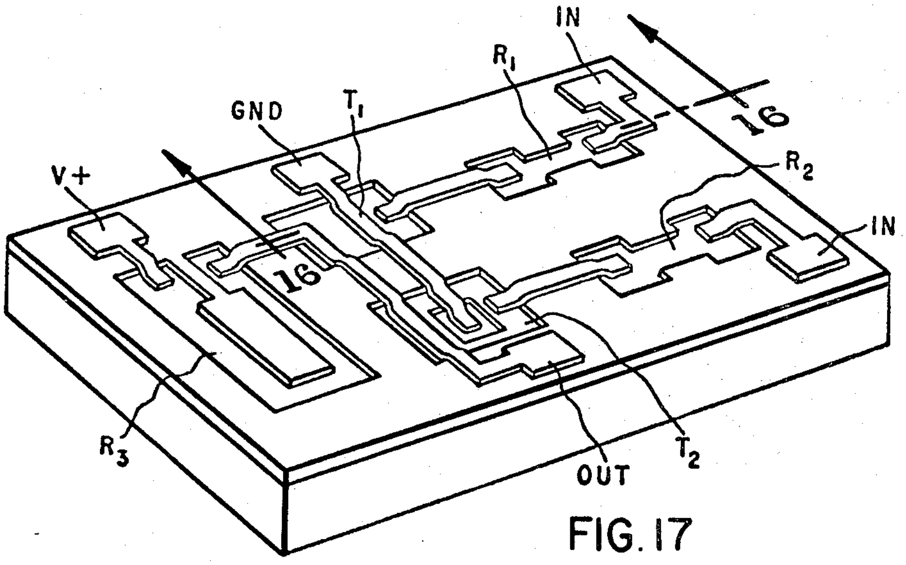
FIG. 17 is an isometric pictorial view of the completed device described with reference to FIGS. 9–16.

Referring again to FIG. 15, it will be observed that the layers 50 and 51 may now serve as active regions into which subsequent diffusions, or upon which epitaxial depositions, may be made in order to fabricate various components of an integrated circuit. Since silicon carbide is a better thermal conductor than silicon oxide, the use of silicon carbide as the isolation layer 30 will allow better heat dissipation for high power devices. Referring now to FIG. 16, a sectional view of a completed integrated circuit is seen, with an NPN transistor $T_1$ and a resistor $R_1$ having been formed by diffusion in the N-type redeposited regions 50 and 51. A P-type diffused region provides the base of the transistor, while an elongated P-type region formed simultaneously with the base provides the resistor $R_1$ N-type diffused regions provide the transistor emitters. The diffusion operations utilize silicon oxide masking so that an oxide layer 52 acquires a stepped configuration in the final device. Openings are made in the oxide where contact is necessary, then metal film is deposited over the oxide and selectively removed to provide the desired contacts and interconnections. The completed unit is seen in FIG. 17, with the transistors $T_1$ and $T_2$ and the resistors $R_1$, $R_2$ and $R_3$ along with the metal film interconnecting providing a logic circuit as seen in schematic form in FIG. 17.

Figure 18:
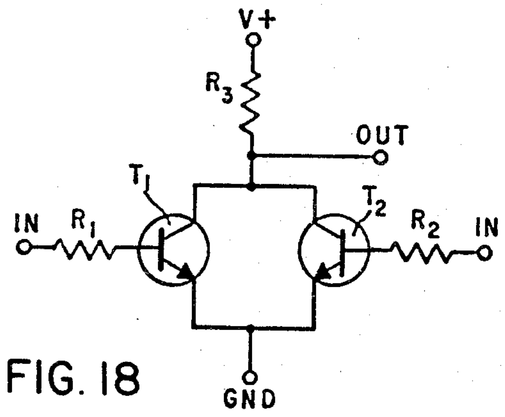
FIG. 18 is a schematic diagram of the integrated circuit contained within the device of FIG. 17.

Although the formation of a specific integrated circuit structure has thus been described (the schematic of the circuit being shown in FIG. 18), it is obvious that using the method of this invention, a multitude of configurations of circuit components may be formed, either as discrete devices or as individual components within a single substrate.

The use of a hard material, such as silicon carbide, as a "stop" is not to be construed so as to be limited to any one specific application. On the contrary, whenever a predetermined amount of semiconductor material is to be removed from a wafer or slice by abrasive methods, such as lapping or polishing, and close control needs to be maintained over the amount and the dimensions of the removed material, the process of this invention is applicable.

Although the previous description has been referenced to the use of silicon carbide as the material forming the lapping or polishing "stops" and the isolation layers, any other refractory material having the proper properties may also be used. The primary requirements for these materials are that they be substantially harder than the semiconductor material that is being removed, have a coefficient of thermal expansion similar to the semiconductor material upon which they are deposited, resistant to those etchants that will etch silicon oxide, and have a relatively high thermal conductivity. Examples of some of these materials are boron and aluminum oxide.

While the invention has been described with reference to specific methods and embodiments, it is to be understood that this description is not to be construed in a limiting sense. Various modifications of the disclosed embodiments, as well as other embodiments of the invention, will become apparent to persons skilled in the art without departing from the spirit and scope of the invention as defined by the appended claims.

What is claimed is:

1. A structure comprising:

a. a wafer of semiconductor material with a mesa region located at one place upon a major face of said wafer, b. a first insulating layer upon said wafer substantially covering said mesa region, and c. a second insulating layer located at least one other place upon said major face near said mesa region and intermediate said wafer and said first insulating layer, said second insulating layer comprising silicon carbide.

2. A structure comprising:

a. a body of semiconductor material with a plurality of pockets of single crystal semiconductor material beneath one major face of said body;

b. a continuous layer of silicon carbide intermediate the said body and the said pockets, said continuous layer of silicon carbide being relatively harder than said pockets of single crystal semiconductor material; and c. individual circuit components comprising semiconductor regions of selected conductivity type and/or resistivity within said plurality of pockets electrically insulated from each other by said continuous layer.

3. The structure as described in claim 2 wherein said continuous layer is composed of high resistivity silicon carbide.

* * * * *